(12) United States Patent
Emmert

(10) Patent No.: US 6,352,434 B1
(45) Date of Patent: *Mar. 5, 2002

(54) HIGH DENSITY FLEXIBLE CIRCUIT ELEMENT AND COMMUNICATION DEVICE USING SAME

(75) Inventor: Steven C. Emmert, Crystal Lake, IL (US)

(73) Assignee: Motorola, Inc., Schaumburg, IL (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/950,637

(22) Filed: Oct. 15, 1997

(51) Int. Cl.[7] ............................................... H01R 12/00
(52) U.S. Cl. ......................................... 439/65; 439/165
(58) Field of Search .............................. 439/65, 59, 60, 439/61, 62, 64, 66, 67, 162, 165

(56) References Cited

U.S. PATENT DOCUMENTS

| | | |
|---|---|---|
| 3,999,826 A | 12/1976 | Yurtin |
| 4,255,640 A | 3/1981 | Bressler |
| 4,471,493 A | 9/1984 | Schober |
| 4,802,605 A | 2/1989 | Salmon et al. |
| 4,825,395 A | 4/1989 | Kinser, Jr. et al. |
| 4,842,531 A | 6/1989 | Takemura |
| 4,845,772 A | 7/1989 | Metroka et al. |
| 4,864,523 A | 9/1989 | Sasaki |
| 4,897,873 A | 1/1990 | Beutler et al. |
| 4,959,887 A | 10/1990 | Gruenberg et al. |
| 4,961,126 A | 10/1990 | Suzuki |
| 5,001,659 A | 3/1991 | Watabe |
| 5,014,346 A | 5/1991 | Phillips et al. |
| 5,027,394 A | 6/1991 | Ono et al. |
| 5,141,446 A | 8/1992 | Ozouf et al. |
| 5,170,173 A | 12/1992 | Krenz et al. |
| 5,259,019 A | 11/1993 | Stilley |
| 5,260,998 A | 11/1993 | Takagi |
| 5,335,273 A | 8/1994 | Takagi et al. |
| 5,394,297 A | 2/1995 | Toedter |
| 5,737,053 A | * 4/1998 | Yomogihara et al. ........ 349/149 |
| 5,760,997 A | * 6/1998 | Koyanagi et al. .............. 360/97 |
| 5,832,080 A | 11/1998 | Beutler et al. |
| 5,844,783 A | * 12/1998 | Kojima ......................... 361/777 |
| 5,897,382 A | * 4/1999 | Takahashi ..................... 439/31 |
| 6,011,699 A | 1/2000 | Murray et al. |

FOREIGN PATENT DOCUMENTS

| | | |
|---|---|---|
| GB | 2 300 670 | 11/1996 |
| JP | 59-135959 | 8/1984 |
| JP | 59-135960 | 8/1984 |
| WO | WO 92/17974 | 10/1992 |
| WO | WO 92/20181 | 11/1992 |
| WO | WO 93/18592 | 9/1993 |

OTHER PUBLICATIONS

Qualcomm Press Release, "Qualcomm Unveils the "Q" Phone: An Extraordinary New Palm–Sized CDMA Digital PCS Phone", Mar. 3, 1997, 4 pages.
Qualcomm Brochure, "the power of digital in the palm of your hand", 2/97, 2 pages.
Pictures of the Qualcomm Q Phone, 6 pages, (No Date).

* cited by examiner

Primary Examiner—Lincoln Donovan
(74) Attorney, Agent, or Firm—Brian M. Mancini; Mark D. Patrick; Hisashi D. Watanabe

(57) ABSTRACT

Apparatus for routing a flexible circuit element (216) between a top housing (102) and a bottom housing (108) in an electronic device such as a radiotelephone (100). The flexible circuit element includes a termination at a tab (2712) off the edge of the flex strip, oriented at an angle from the direction of trace routing. This provides the minimum possible flex width so that the flex may be routed through minimally sized openings, in turn minimizing the size of the electronic device.

11 Claims, 11 Drawing Sheets

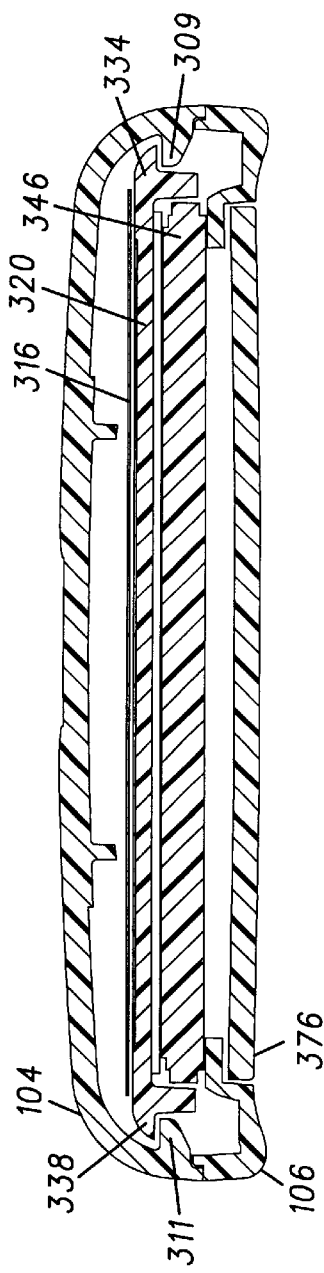
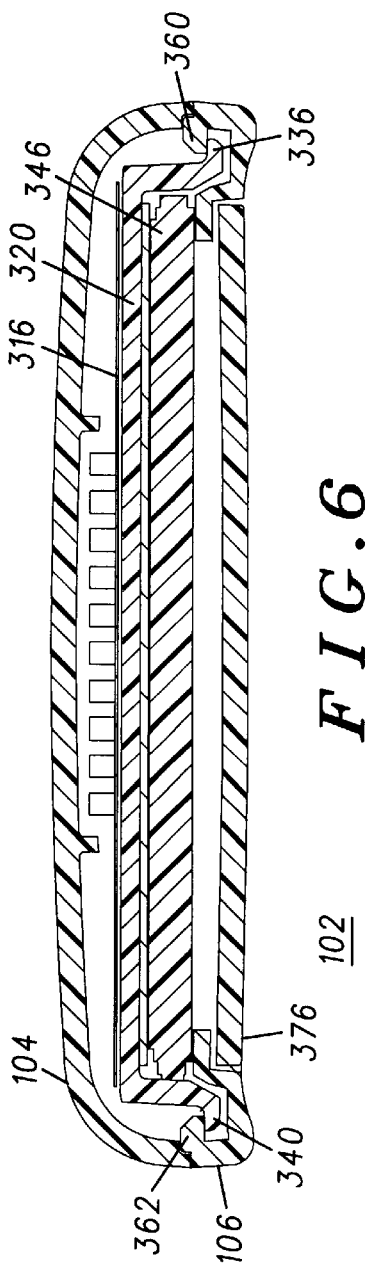

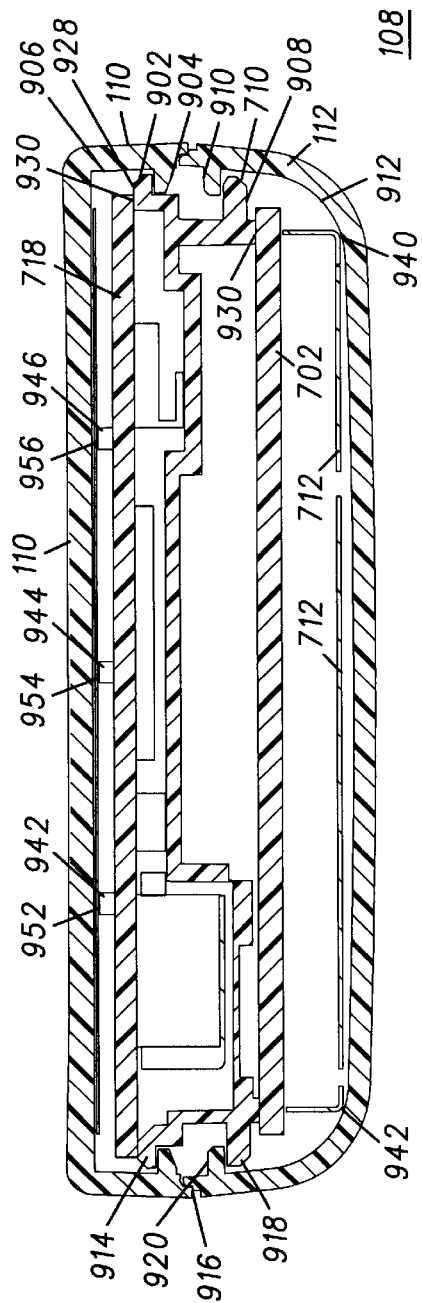
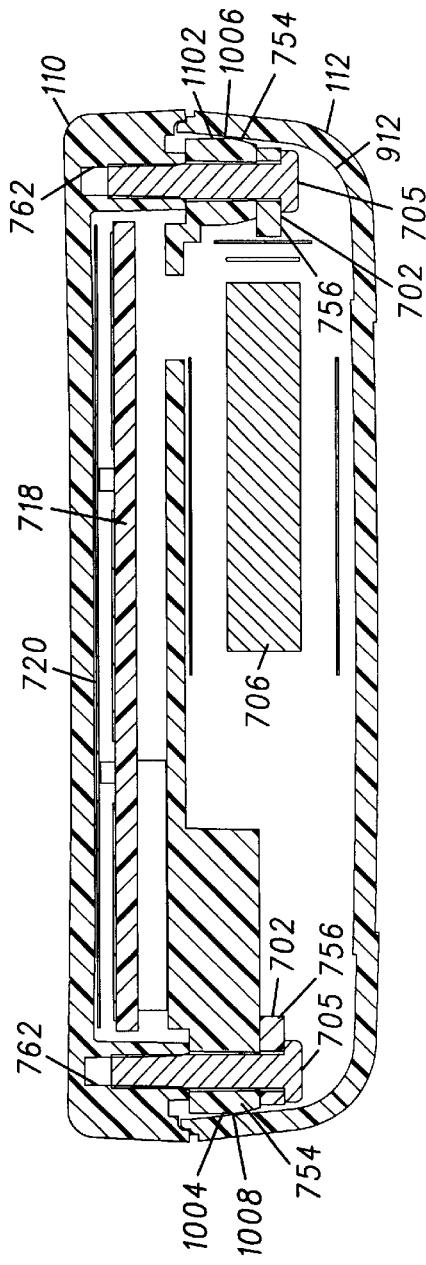

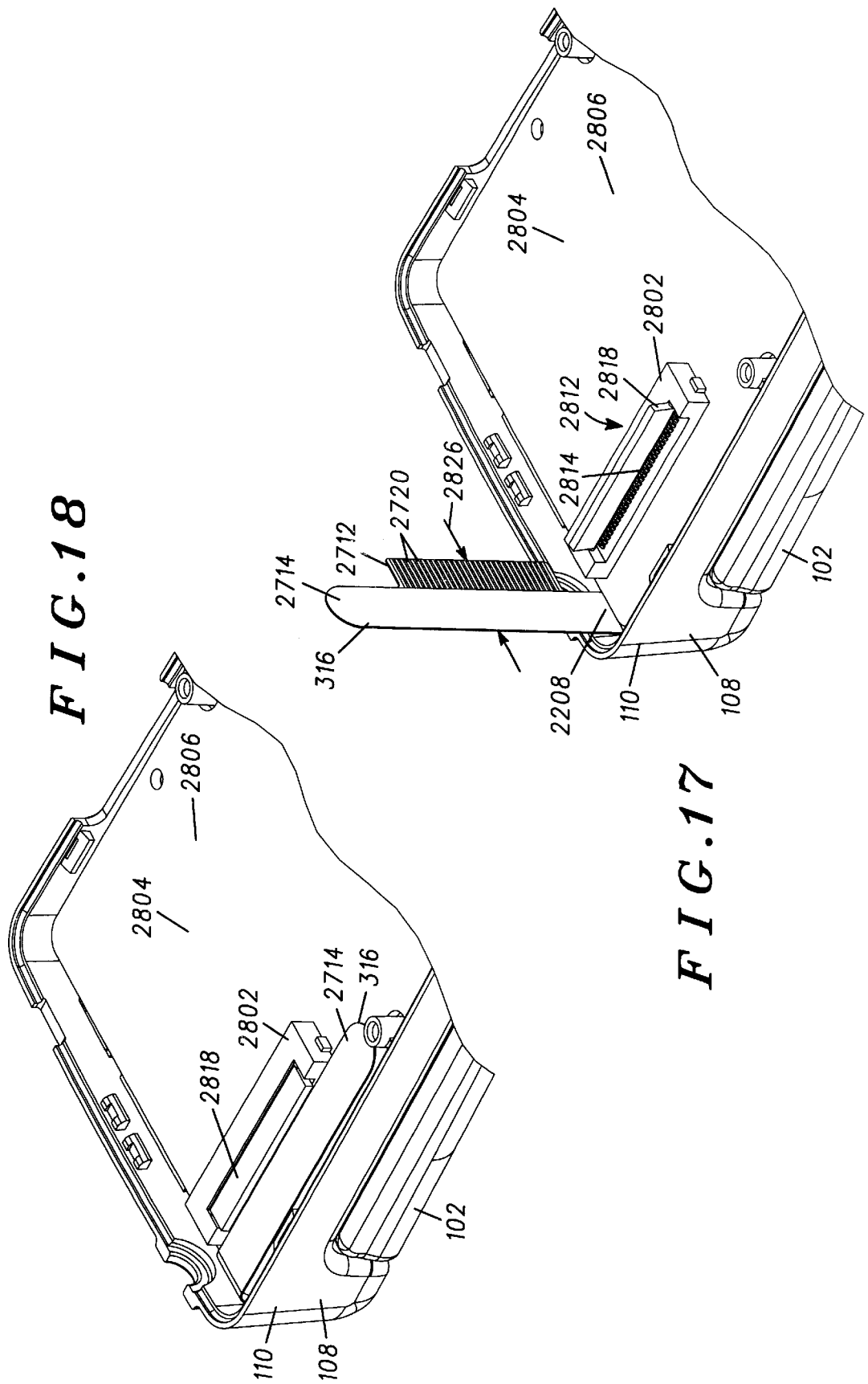

HIGH DENSITY FLEXIBLE CIRCUIT ELEMENT AND COMMUNICATION DEVICE USING SAME

FIELD OF THE INVENTION

The present invention generally relates to apparatus for routing conductors. More particularly, the present invention relates to an electronic device including an improved apparatus for routing flexible circuit conductors.

BACKGROUND OF THE INVENTION

Electronic devices continually are reduced in size and weight, particularly portable electronic devices. One example of such a portable electronic device is a portable communication device such as a pager or a radiotelephone.

Reduction in size and weight provides convenience for the user. Smaller electronic devices are more easily carried and thus may be used in more applications in more locations. Smaller lighter electronic devices are designed for easy, portable use.

One technique for reducing size of electronic devices is providing more than one housing containing the operational circuitry. A movable housing element is provided which can be collapsed or folded against another housing element to reduce the size of the electronic device in a stowed position, and extended or unfolded to an operational position. Examples of such electronic devices include foldable radiotelephones of the type having a hinged keypad cover and of the clam shell type.

However, during use of foldable housing elements, operational circuitry in the separate housing elements must communicate. For example, radiotelephones with hinged keypad covers have included a microphone or an antenna in the keypad cover which must be electrically coupled to the main radio circuit in the main housing. Flexible circuit elements, or flex strips, or flex, have been developed to convey electrical signals using metallic conductors on a flexible substrate.

As electronic devices continue to shrink, the desire has remained to more evenly distribute the operational circuitry between multiple housing elements This means flexible circuit elements must have more conductors or traces to handle increased number of signals. More conductors increase the width of the flexible circuit element. However, wider flex strips create additional problems of routing between housing elements and of termination to a printed wiring board (PWB).

In one known clam shell radiotelephone design, a hinge element between upper and lower housings is interrupted to provide a flex barrel routing a flex between the housings. This radiotelephone uses a stationary, externally exposed housing for the routing of the flex as well as a stationary shaft, on which a movable housing pivots. Use of so many elements complicates the assembly and thereby increases the manufacturing cost of the radiotelephone. Moreover, the flex circuit is still visible where it passes from the flex barrel to the housing. Since it is visible, it is also susceptible to damage and can detract from the appearance of the radio.

At the printed wiring board, the flex strip must be electrically terminated. Connectors such as a zero insertion force (ZIF) connector have been developed to mechanically receive the end of a flex strip and create an electrical connection between conductors or traces on the flex and conductors on the PWB. However, the spacing of the electrical conductors on the ZIF connector is limited by manufacturing tolerances. The current limitation is typically 0.50 mm conductor pitch. When used with flex having a large number of traces, such a connector is too large for practical use. A flex strip with 30 traces requires a connector more than 15 mm wide. This is too large to accommodate on a PWB of many small electronic devices. Moreover, routing a flex strip 15 mm wide may not be mechanically possible, given the small size of mechanical features.

Accordingly, there is a need in the art for improved method and apparatus for routing flexible circuit elements in electronic devices.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, and wherein:

FIG. 5 is a cross sectional view of the top housing taken along a line 5–5' of FIG. 1;

FIG. 6 is a cross sectional view of the top housing taken along a line 6–6' of FIG. 1;

FIG. 9 is a cross sectional view taken along line 9–9' of FIG. 2;

FIG. 10 is a cross sectional view taken along line 10–10' of FIG. 2;

FIG. 17 shows a detailed view of the radiotelephone of FIG. 1; and

FIG. 18 shows a detailed view of the radiotelephone of FIG. 1.

DETAILED DESCRIPTION OF A PREFERRED EMBODIMENT

Figure 1:
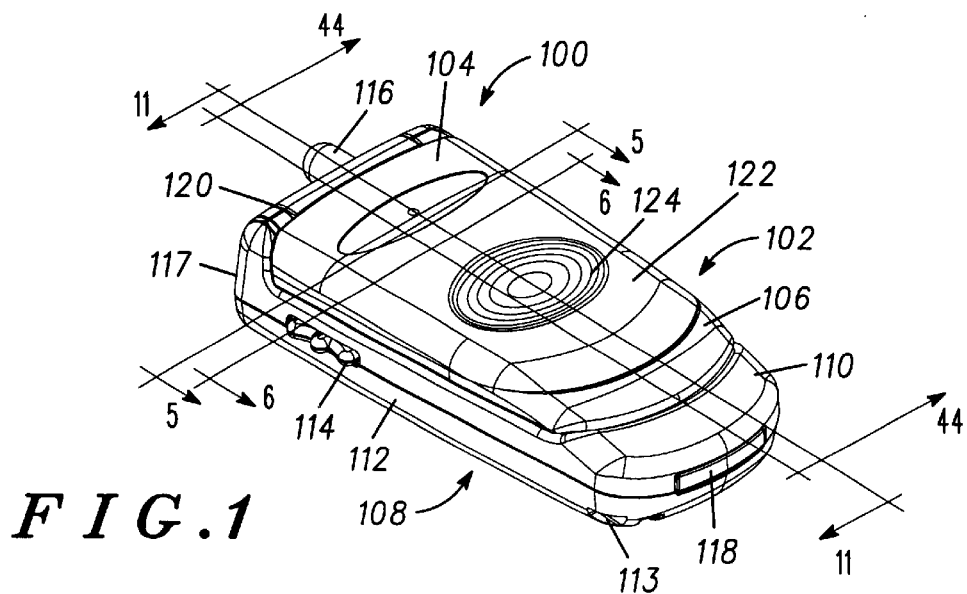
FIG. 1 is a perspective view of a radiotelephone in a closed position.

Turning to FIG. 1, a perspective view shows a radiotelephone 100 in a closed position. Radiotelephone 100 comprises a top housing 102 having a back portion 104 and a front portion 106, and a bottom housing 108 having a front portion 110 and a back portion 112. The back portion of the bottom housing includes a first guide slot 113, which will be described in more detail in the remaining figures. The bottom housing also includes a switch assembly 114 preferably on the side of the radiotelephone and an antenna 116 generally extending from the rear 117 of the radiotelephone. A connector 118 is also provided to generally enable input/output data or provide a port for a cigarette lighter adapter. An indicator 120, such as a light guide for a light emitting diode (LED), is incorporated in a knuckle of the hinge of the radiotelephone. Finally, back portion 104 of the top housing comprises a top surface 122 having a finger locator 124.

Figure 2:
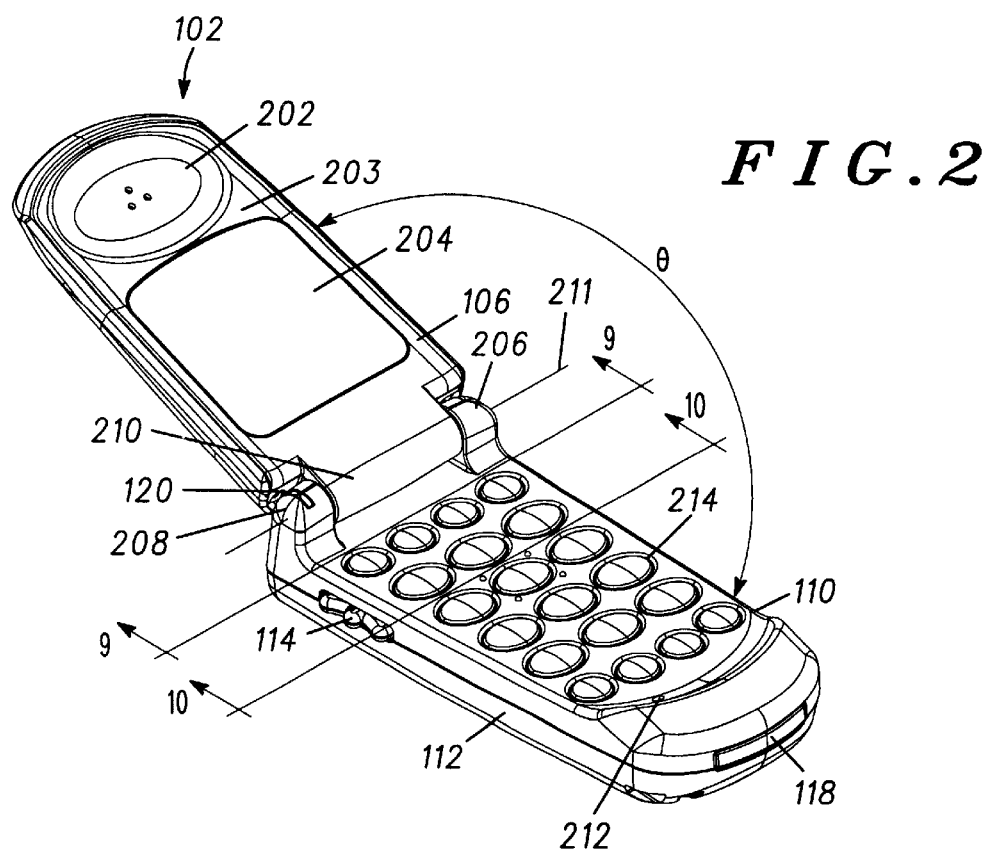
FIG. 2 is a perspective view of the radiotelephone of FIG. 1 in an opened position.

Turning now to FIG. 2, radiotelephone 100 in the open position shows top housing 102 hingedly connected to bottom housing 108. Front portion 106 of the to housing comprises an ear piece 202 defined in bottom surface 203 and a lens 204 positioned in an aperture in the top housing. Front portion 110 of the bottom housing comprises a first knuckle 206 and a third knuckle 208 which are coupled to second knuckle 210 of the top housing 102. The operation of the hinge will be described in more detail in reference to the remaining figures.

Figure 3:
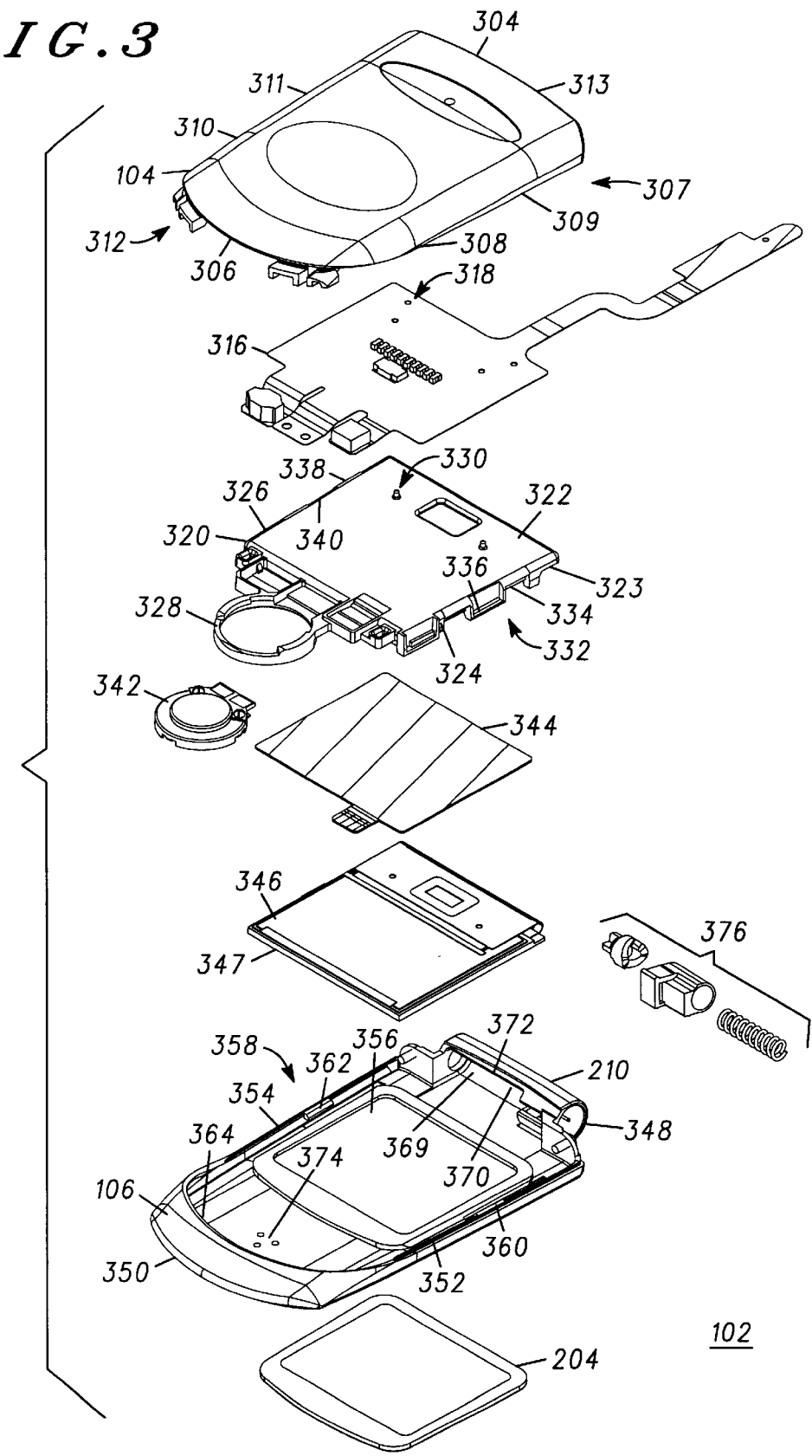
FIG. 3 is a top perspective exploded view of a top housing of the radiotelephone.
Figure 4:
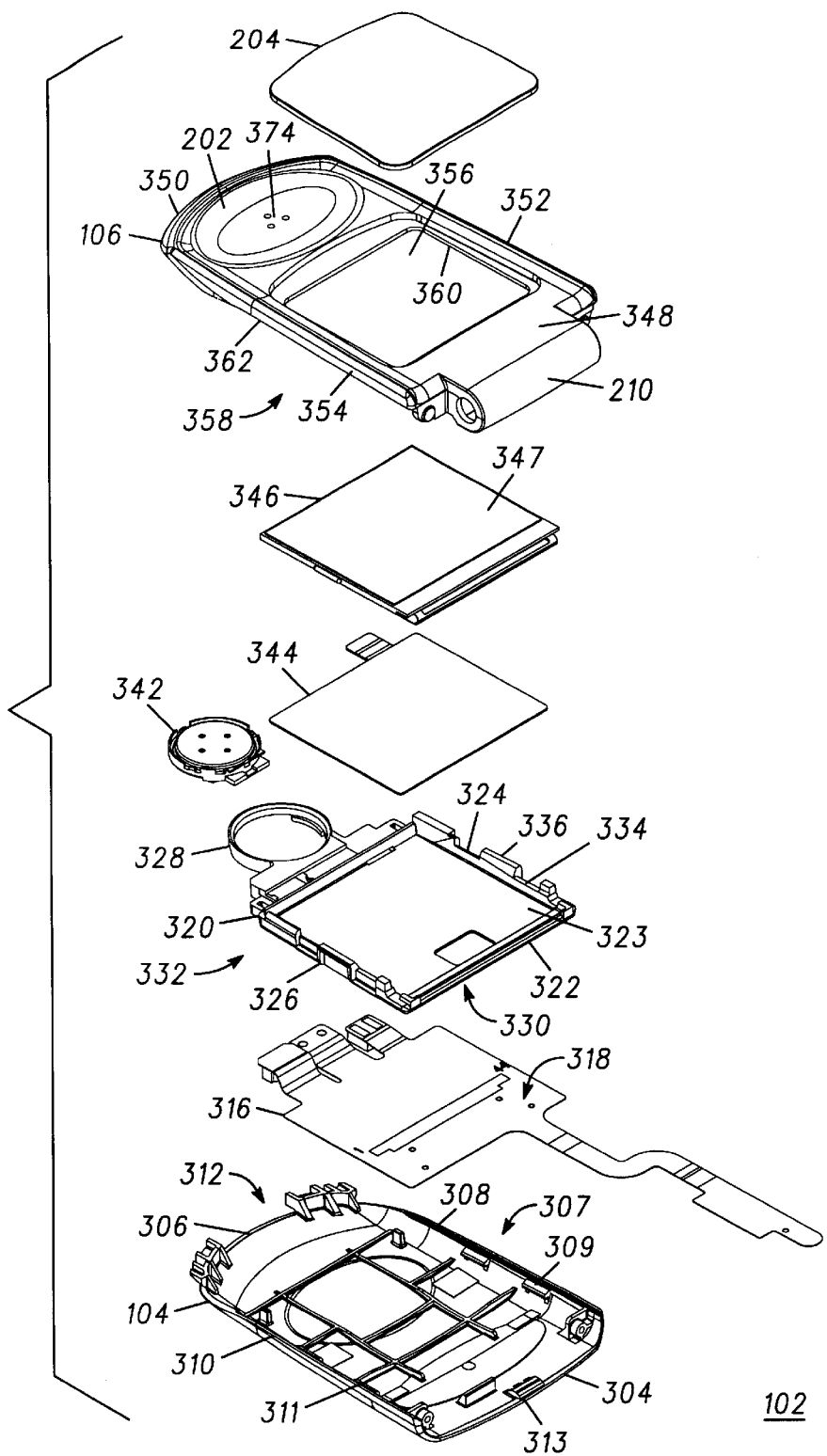
FIG. 4 is a bottom perspective exploded view of the top housing of the radiotelephone.

FIG. 3 and FIG. 4 show a top perspective exploded view and a bottom perspective exploded view, respectively, of top housing 102. Top housing 102 includes back portion 104, a flexible circuit element 316, a chassis 320, a speaker 342, an electro luminescent (EL) panel 344 with an adhesive backing, a display 346 having a display area 347, front portion 106, and lens 204.

Back portion 104 defines a first end 304, a second end 306, a first side 308, and a second side 310. As shown clearly in FIG. 3, back portion 104 includes a plurality of tabs 312 located on second end 306. The plurality of tabs 312 may include a longer single tab (not shown) along a tip of second end 306. As shown clearly in FIG. 4, back portion 104 also includes a tab 313 on first end 304 and a plurality of tabs 307 on first and second sides 308 and 310, such as a tab 309 on first side and a tab 311 on second side 310.

Referring back to FIG. 3, chassis 320 defines a surface 322, a surface 323, a first side 324, and a second side 326. Chassis 320 forms a speaker retainer 328, a plurality of tabs 330 on surface 322, and a plurality of catches 332 along first side 324 and second side 326. The plurality of catches 332 includes catches 334 and 336 on first side 324 and catches 338 and 340 on second side 326 (more clearly shown in FIG. 4). The plurality of catches 332 alternate along first and second sides 324 and 326 with catch surfaces facing opposing directions and elevated at different heights.

Front portion 106 defines a first end 348, a second end 350, a first side 352, a second side 354. As shown clearly in FIG. 4, front portion 106 defines earpiece 202 having a plurality of holes 374 defined therein and an opening 356. As shown clearly in FIG. 3, front portion 106 also includes second knuckle 210 on first end 348, a slot 364 or a lip on second end 350, and a plurality of tabs 358 along first side 352 and second side 354. The plurality of tabs includes a tab 360 on first side 352 and a tab 362 on second side 354. Second knuckle 210 forms a pocket 370 for a hinge 376 and an aperture 369 to pocket 370.

Top housing 102 may be assembled as follows. Flexible circuit element 316 is disposed on surface 322 of chassis 320 such that the plurality of tabs 330 insert through the plurality of holes 318 for proper alignment and retention. Speaker 342 is disposed in and retained by speaker retainer 328 and coupled to flexible circuit element 316. EL panel 344 is adhered to surface 323 of chassis 320 and display 346 is placed in abutment therewith.

Carrying flexible circuit element 316, speaker 342, EL panel 344, and display 346, chassis 320 is disposed in front portion 104. Chassis 320 and front portion 104 are made from a pliable material and are sized to provide a snap fit therebetween, where the plurality of tabs 307 engage some of the plurality of catches 332. For example, as shown in FIG. 5, which is a cross section view taken along a line 5–5' of FIG. 1, tab 309 engages catch 334 on first side 308 and tab 311 engages catch 338 on second side 310.

Referring back to FIG. 3 and FIG. 4, lens 204 is disposed on front portion 106 around a perimeter of opening 356 and is secured thereto. Second end 306 of back portion 104 is brought toward second end 350 of front portion 106 such that the plurality of tabs 312 insert within slot 364. First end 304 of back portion 104 is brought toward first end 348 of front portion 106 such that tab 313 meets an edge 372 of second knuckle 210. Chassis 320, front portion 106, and back portion 104 are made from a pliable material and are sized to provide a snap fit therebetween, where tab 313 overcomes edge 372 and the plurality of tabs 358 engage some of the plurality of catches 332. For example, as shown in FIG. 6, which is a cross section view taken along a line 6–6' of FIG. 1, tab 360 engages catch 336 and tab 362 engages catch 340.

Thus, back and front portions 104 and 106 are secured to each other with the plurality of tabs 312, tab 313, slot 364, and aperture 369. Also, back portion 104 is secured to chassis 320 with the plurality of tabs 307 and some of the plurality of catches 332, and front portion 104 is secured to chassis 320 with the plurality of tabs 358 and some of the plurality of catches 332.

Figure 7:
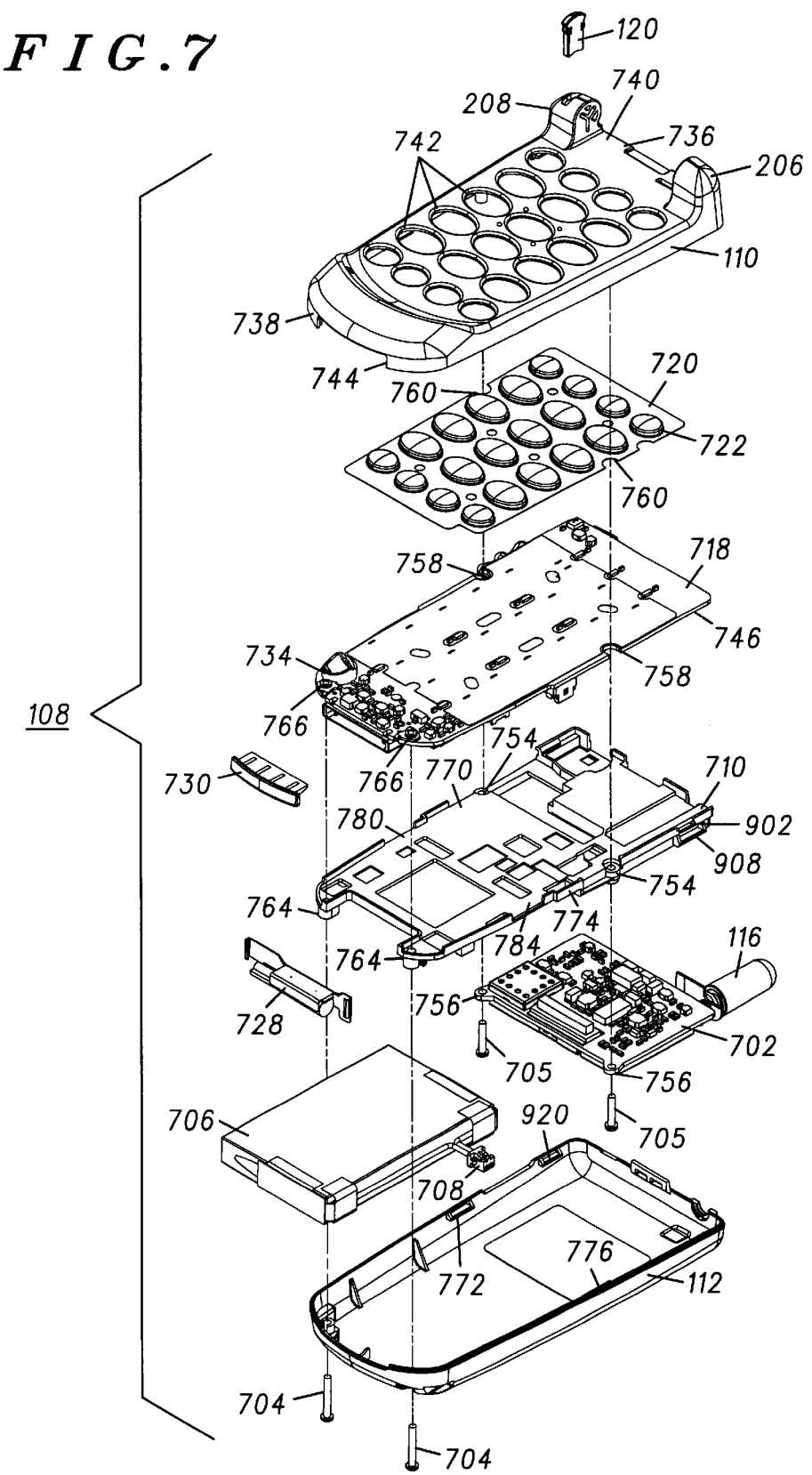
FIG. 7 is a first exploded view of the bottom housing of the radiotelephone of FIG. 1.

Referring now to FIG. 7, an exploded view of the bottom housing 108 of the radiotelephone 100 shows the components of the bottom housing 108. The bottom housing 108 includes the front portion 110, a keypad 720 including a plurality of keys 722, a logic board 718, a chassis 710, a transceiver board 702, a battery 706 and a back portion 112. The bottom housing 108 further includes a vibrator assembly 728, a data port cover 730 and the indicator 120.

The front portion 110 defines the top surface 740 of the bottom housing 108 and provides the structure which engages the top housing 102. At a first end 736, the front portion 110 includes the first knuckle 206 and third knuckle 208. The top surface 740 defines a plurality of keyholes 742 through which extend the keys 722 of the keypad. The keyholes 742 are sized and positioned to receive the keys 722. At a second end 738, the front portion 110 defines an aperture 744 which provides access to the connector 118. The top surface 740 of the bottom housing 108 is contoured to fit the top housing 102 when the radiotelephone 100 is folded closed.

The keypad 720 including the keys 722 is preferably formed from a single membrane to be impervious to dirt and moisture. The keys 722 may be arranged in any suitable configuration, including differing numbers and sizes of keys. The illustrated configuration is illustrative only. The keypad 720 rests on metal domes which provide a snap feel during key actuation.

The keypad 720 is disposed in the bottom housing 108 next to the logic board 718. The logic board 718 generally includes a printed wiring board (PWB) 746 with components such as integrated circuits 748 attached to the PWB 746. The logic board 718 provides electronic functionality for the radiotelephone 100. Thus, the logic board 718 generally includes a processor or other controller which controls speech processing, timing, man-machine interface and system interface functions Subsystems of the logic board 718 include a clock circuit which generates timing signals, a speech processor, a battery monitor including internal recharge control, memory for data storage, and input/output control.

Figure 8:
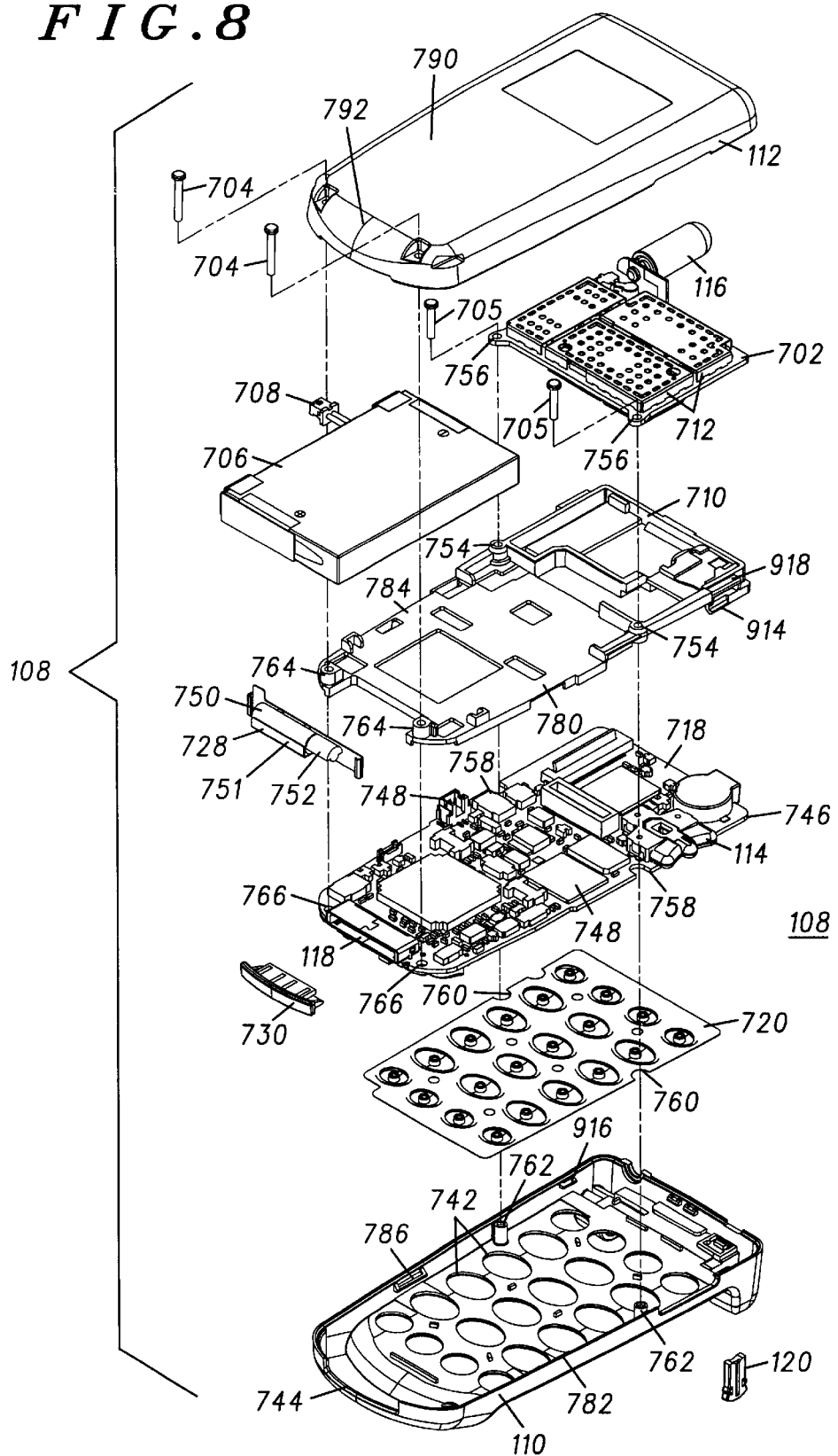
FIG. 8 is a second exploded view of the bottom housing of the radiotelephone of FIG. 1

Similarly, the transceiver board 702 controls the RF operation of the radio. The transceiver board 702 generally includes a transmitter, a power amplifier, a receiver, a duplexer or antenna switch, filters, a demodulator, a modulator and a frequency synthesizer. As is shown in FIG. 8, a portion of the circuitry on the transceiver board 702 is covered by one or more RF shields 712 to limit electromagnetic interference with surrounding circuitry.

The battery 706 in the illustrated embodiment is a self-contained, non-replaceable, rechargeable battery. The battery 706 is electrically coupled to the remainder of the radiotelephone 100 by a connector 708 which plugs into a suitable receptacle 748 on the logic board 718. In alternative embodiments, the battery 706 may be replaceable, for example, by removing a panel and disconnecting the battery 706. In the present embodiment, a non-removable battery was chosen to reduce the size of the radiotelephone 100 while maximizing the physical size and storage capacity of the battery 706. If the battery is removable, the battery 706 must be encased in a protective plastic housing, which limits the volume available for storage cells of the battery. Using a non-removable battery without a protective plastic case maximizes the volume used for storage cells and thereby maximizes the storage capacity of the battery 706.

The vibrator assembly 728 includes a motor 750 and a cam 752 and a vibrator bracket 753. To provide a silent alert, in lieu of or in addition to an audible ringer tone, the radiotelephone 100 under control of the logic board 718 turns on the motor 750 to turn the cam 752. When rotated, the unbalanced shape of the cam 752 produces a vibration sensation which alerts the user of an incoming call or other condition. The vibrator motor 750 is disposed on the vibrator bracket 751. The vibrator bracket 751 is located on and retained by one or more bosses so that the vibrator assembly rests on top of connector 118 (as viewed in FIG. 8). Thus, the vibrator assembly 728 is contained within the bottom housing 108 without occupying any space on the logic board 718.

The data port cover 730 fits in the aperture 744 formed by the front portion 110 to cover and protect the connector 118. In alternative embodiments, the data port cover 730 may be retained by a lanyard or other means to prevent loss.

A pair of screws 705 retains the transceiver board 702, the chassis 710, the logic board 718 and the keypad 720 with the front portion 110. The transceiver board 702 includes grommets 756 which engage the heads of the screws 705. The chassis 710 includes grommets 754 through which the screws 705 pass. Similarly, the logic board 718 includes cutouts 758 and the keypad includes cutouts 760 which engage the screws 705. The front portion 110 includes threaded retainers 762 which receive and retain the screws 705.

A second pair of screws 704 retains the back portion 112, the chassis 710 and the logic board 718. The screws 704 are inserted through the back portion 112 and extend through bosses 764 of the chassis 710. The threaded ends of the screws 704 are then inserted in holes 766 of the logic board 718 to complete the assembly.

Referring now to FIG. 9, it shows a cross section of the bottom housing 108 taken along line 9–9' in FIG. 2. FIG. 9 shows the manner in which components of the bottom housing 108 are securely retained in the bottom housing 108. FIG. 9 shows the logic board 718, the chassis 710 and the transceiver board 702 disposed in the assembled bottom housing 108.

The chassis 710 includes snap-fit tabs which engage corresponding tabs of the front portion 110 and the back portion 112 of the bottom housing 108. On the right side of FIG. 9, the chassis 710 includes a tab 902 which engages a tab 904 on the inner surface 906 of the front portion 110. Similarly, the chassis 710 includes a tab 908 which engages a tab 910 on the inner surface 912 of the back portion 112. On the left side of FIG. 9, the chassis 710 includes a tab 914 which engages a tab 916 on the inner surface 906 of the front portion 110 and a tab 918 which engages a tab 920 on the inner surface 912 of the back portion 112. Some of these tabs are visible in FIG. 7 and FIG. 8. As can be seen in FIG. 7, the chassis 710 further includes a tab 770 which engages a tab 772 on the back portion 112 and a tab 774 which engages a tab 776 on the back portion 112. In FIG. 8, the chassis 710 further includes a tab 780 which engages a tab 782 on the front portion 110 and a tab 784 which engages a tab 786 on the front portion 110. These tabs serve to securely locate and retain the chassis 710 in place in the bottom housing 108.

Referring again to FIG. 9, in particular the right side of FIG. 9, to retain the logic board 718, a point 928 of the chassis 710 engages the logic board 718 at a first point 930 on the logic board. Preferably, the point 928 is a portion of the tab 902 such that the logic board 718 asserts a force on the tab 902 in a first direction (downward in FIG. 9) which is opposite the second direction (upward in FIG. 9) of the force asserted by the tab 904 of the front portion 110. The counteracting forces operate to snugly retain all elements. Similarly, a point 930 on the chassis 710 engages the transceiver board 702 at a point 932 on the transceiver board. Again, preferably, the point 930 is a portion of the tab 908 such that the transceiver board 702 asserts a force on the tab 908 in the second direction which is opposite the first direction of the force asserted by the tab 910 of the back portion 112. The chassis 710 engages the logic board 718 and the transceiver board 702 in a similar manner on left side of FIG. 9.

This manner of engaging the front and back portions and the transceiver and logic boards operates to lock all components in place and reduces the need for screws to hold the bottom housing 108 together. Screws add to the manufacturing cost and weight to the completed assembly, so a snap-fit design is preferable.

To further brace the assembled components within the bottom housing 108, the RF shield 712 of the transceiver board engages the inner surface 912 of the back portion 112 at point 940 and point 942. Similarly, the logic board 718 includes a protrusion 942, a protrusion 944 and a protrusion 946 which all engage the front portion 110 at a point 952, point 954 and point 956, respectively. In the illustrated embodiment, a portion of the keypad 720 is retained between the protrusions and the engagement points to secure the keypad 720.

Also in the illustrated embodiment, the securement structure illustrated in the cross section of FIG. 9 is located at the end of the radiotelephone 100 which connects to the top housing 102. Because of the movement of the top housing 102 relative to the bottom housing 108, and because of potential added forces on the hinge assembly which joins the two housings, this area may be subject to particularly strong destructive forces. The illustrated securement structure reinforces the front portion 110 which includes the first knuckle 206 and the third knuckle 208, which join to the top housing 102.

Referring now to FIG. 10, it shows a cross section of the bottom housing 108 taken along line 10–10' in FIG. 2. FIG. 10 shows location and retention of the transceiver board 702, the chassis 710, the logic board 718 and the keypad 720 within the front portion 110 and the rear portion 112 of the bottom housing. In FIG. 10, the screws 705 extend through the grommet 756 and grommet 754 and are seated in the threaded retainers 762. A point 1002 and a point 1004 of the chassis 710 engage the inner surface 912 of the back portion 112 at a point 1006 and 1008, respectively. As is illustrated in FIG. 10, point 1002 and point 1004 are on the outer surface of the grommets 756. In this manner, the chassis 710 retained in place against laterally or torsional forces, both by the screws 705 and the engagement with the back portion 112.

Figure 12:
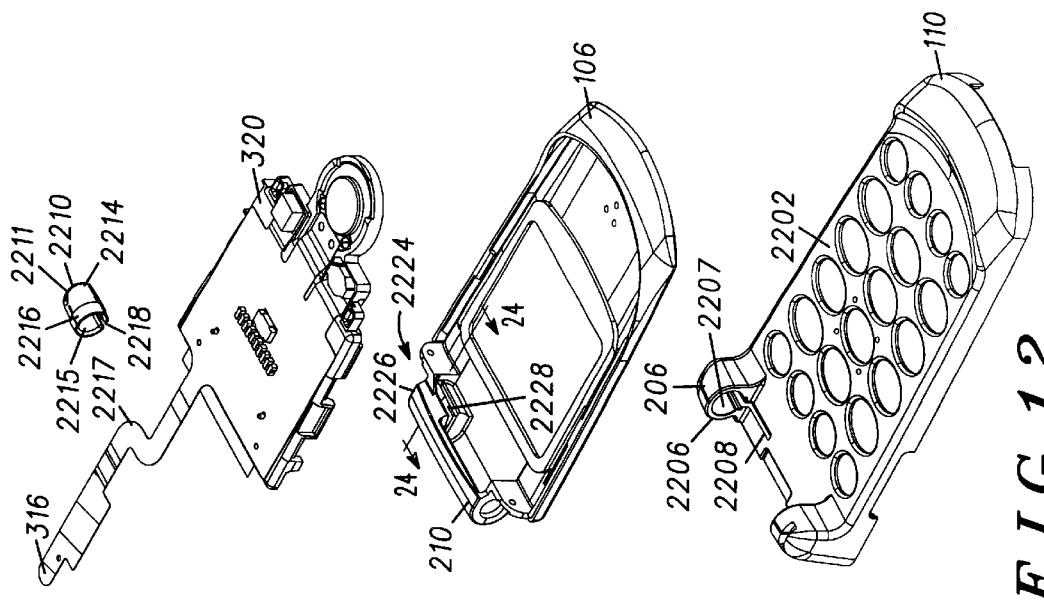
FIG. 12 is a second exploded view of the portion of the radiotelephone of FIG. 22.
Figure 11:
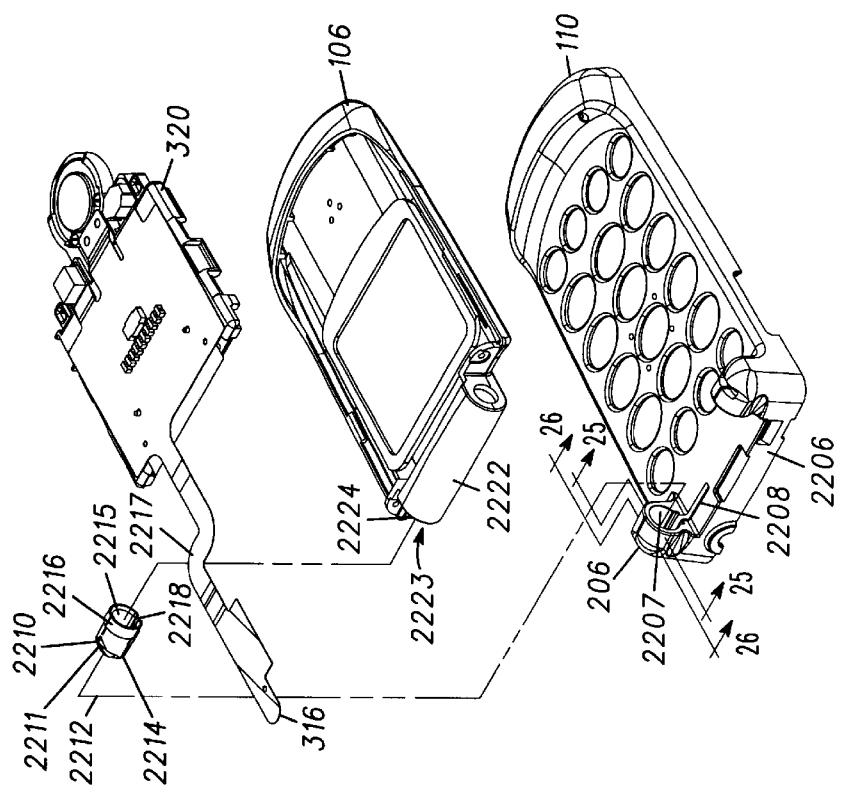
FIG. 11 is a first exploded view of a portion of the radiotelephone of FIG. 1.

Referring now to FIG. 11 and FIG. 12, a flexible circuit element 316 is routed between the top housing 102 and the bottom housing 108. The bottom housing 108 is a first housing containing first electronic circuitry, including the transmitter, receiver and controller. The bottom housing 108 has a front surface 2202 and a first knuckle 206 disposed on the front surface 2202 at one end 2206. The front surface 2202 defines a first hinge aperture 2207. In the illustrated embodiment, the first hinge aperture 2207 is the inner bore of the first knuckle 206. The front surface 2202 defines a slot 2208 adjacent the first hinge aperture 2207. The first knuckle 206 forms a first hinge portion having a slot.

A shaft 2210 extends from the bottom housing 108 at the first knuckle 206 along an axis 2212. The shaft 2210 includes a barrel 2214 defining a bore 2215 and a bearing surface 2216. The barrel 2214 is sized for insertion in the first hinge aperture 2207. The shaft 2210 defines a shaft slot 2218 on one side of the shaft 2210. The shaft slot 2218 extends along a side of the barrel 2214 a distance sufficient to permit insertion of the flexible circuit element 316 through the shaft slot during assembly of the bottom housing 108 and the top housing 102.

In the illustrated embodiment, the shaft 2210 and the bottom housing 108 are separate elements. In alternative embodiments, bottom housing 108 and the shaft 2210 are molded in a single assembly. Unitary assembly provides the advantage of reducing parts count and simplifying assembly. In either embodiment, the bearing surface 2216 is a slotted bearing surface, including a slot suitable to receive a portion of the flexible circuit element 316 during assembly.

The shaft 2210 has a distal end 2211 having a curved outer surface. The bore 2215 has a distal end within the shaft 2210 having a corresponding curved inner surface. The inner surface curves in a radius and contour to match a shoulder 2217 of the flexible circuit element 316 after the flexible circuit element 316 has been inserted in the shaft slot 2218 and is retained in the bore 2215. By curving the inner surface to conform to the shape of the flex, the required length of bore 2215 and thus the length of the shaft 2210 are minimized. This reduces the necessary width of the radiotelephone and helps to produce a smaller, more portable product.

The top housing 102 is a second housing containing second electronic circuitry, such as the display 346 and the speaker 342. The top housing 102 includes a second knuckle 2220 aligned with the first knuckle 206 and the shaft 2210 for rotation about the axis 2212. The second knuckle 210 forms a second hinge portion and together with the first knuckle forms a hinge. One side 2222 of the second knuckle 210 defines a second hinge aperture 2223 and has an open end 2224. The second knuckle 210 defines an inner rotation surface 2226 which pivotably engages the bearing surface 2216 of the shaft 2210. The shaft 2210 is sized for insertion in the second hinge aperture 2223. The second knuckle 210 defines a second knuckle slot 2228 proximate the second electronic circuitry. The second knuckle slot 2228 has a slot width. The inner rotation surface 2226 pivots or rotates on the bearing surface 2216 as the top housing 102 moves in relation to the bottom housing 108.

The shaft slot 2218 aligns with the slot 2208 in the bottom housing 108 for routing the flexible circuit element 316 between the bottom housing 108 and the top housing 102. The flexible circuit element 316, coupling the first electronic circuitry and the second electronic circuitry, is routed from the top housing 102 through the second knuckle slot 2228, through the open end 2224 of the second knuckle 210 and through the shaft slot 2218 and the slot 2208 to the bottom housing 108. In one embodiment, to route the flexible circuit element 316 between the movable housing elements, the top housing 102 is assembled by inserting the flexible circuit element 316 in the aperture or second knuckle slot 2228 with the flexible circuit element 316 extending from the open end 2224 of the second knuckle 210. The flexible circuit element is extended through the slotted bearing surface of bearing surface 2216 and the bore 2215 of the shaft 2210 and through the slot 2208. Finally, the shaft 2210 is positioned in the second hinge aperture 2223 so that the inner rotation surface 2226 engages the bearing surface 2216.

This structure thus provides a stationary bearing surface for the top housing 102 to pivot around. It further provides a stationary element, the shaft, for the flexible circuit element to feed through between top and bottom housings. The shaft limits movement of the flexible circuit element and eliminates external exposure of the flexible circuit element. This prevents damage or contamination of the flexible circuit element. Moreover, hiding the bearing surface, slot, shaft and routing of the flexible circuit within the hinge improves the external appearance of the radiotelephone 100 and gives a more finished look. Also, parts count and thus manufacturing cost is reduced over previous designs that used separate components for flex routing and for a bearing surface.

Figure 15:
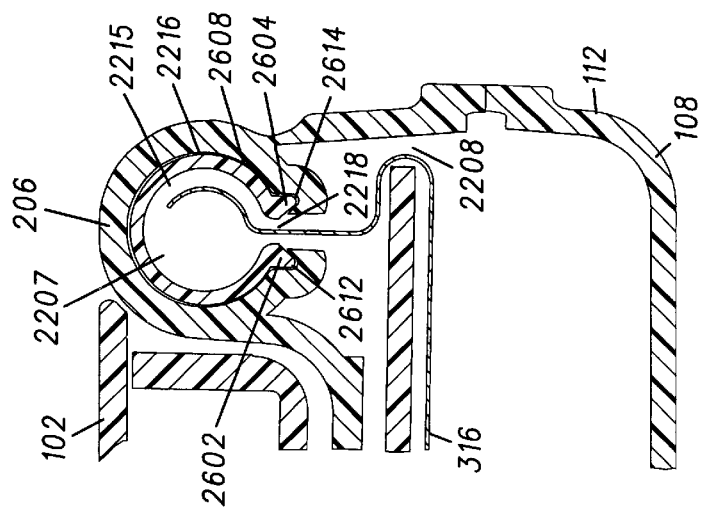
FIG. 15 is a cross sectional view taken along line 26–26' of FIG. 22.
Figure 14:
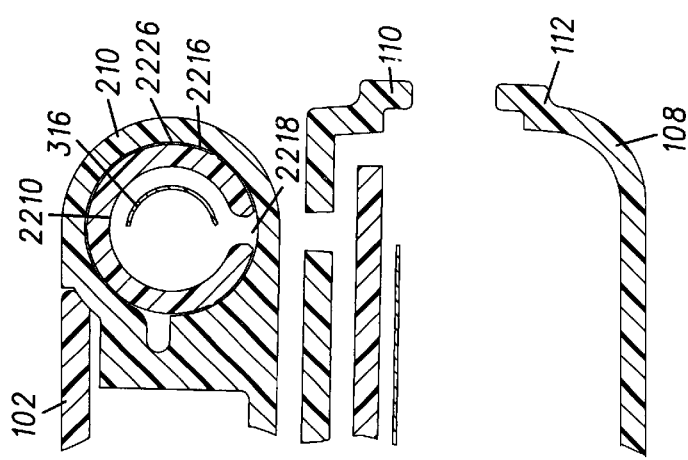
FIG. 14 is a cross sectional view taken along line 25–25' of FIG. 22.
Figure 13:
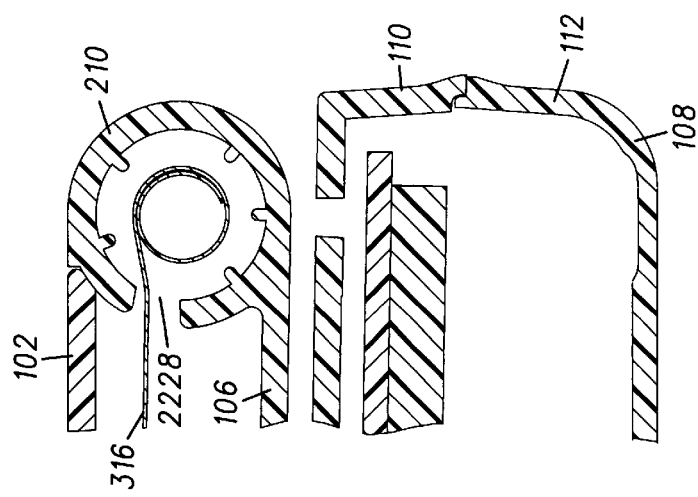
FIG. 13 is a cross sectional view taken along line 24–24' of FIG. 23.

FIG. 13 is a cross sectional view along line 24–24' in FIG. 12. FIG. 14 is a cross sectional view along lines 25–25' in FIG. 11. FIG. 15 is a cross sectional view along line 26–26' in FIG. 11. These figures illustrate routing of the flexible circuit element 316 between the top housing 102 and the bottom housing 108. In FIG. 13, the flexible circuit element 316 extends through the second knuckle slot 2228 and turns 540° within the second hinge aperture 2223. In other applications, the turns may be omitted in favor of a straight, uncurled run of flexible circuit element 316. In FIG. 14, the bearing surface 2216 engages the inner rotation surface 2226. The shaft slot 2218 is visible in the slotted bearing surface of the shaft 2210. In FIG. 15, the shaft 2210 is inserted in the first knuckle 206 and the flexible circuit element 16 extends from the bore 2215 of the shaft 2210 through the shaft slot 2218 and the slot 2208 into the bottom housing 108.

FIG. 14 also shows a notch 2506 formed in the top housing 102. Notch 2506 increases the slot width of the second knuckle slot 2228 to facilitate insertion and routing of the flexible circuit element 316.

In accordance with the present invention, the shaft 2210 includes a first set of retention features and the first hinge aperture 2207 includes a second set of corresponding retention features configured for engagement by the first set of retention features to prevent radial deformation of the shaft 2210. In FIG. 15, the first set of retention features includes one or more ribs such as rib 2602 and rib 2604 disposed on the outer surface 2608 of the shaft 2210. The second set of corresponding retention features includes one or more grooves such as groove 2612 and groove 2614 on the inner surface 2616 of the first hinge aperture 2207. The ribs engage the grooves to prevent radial deformation. The ribs hold the shaft slot 2218 open and prevent the shaft 2210 from pinching the flexible circuit element 316. Preferably, at the bearing surface 2216, the ribs abut the top housing 102 which prevents the shaft 2210 from coming out of the first hinge aperture 2207.

In another embodiment, other ribs may be added to the outer surface of the shaft 2210 to create a slight pressure fit of the shaft 2210 into the first knuckle 206. The pressure fit serves to hold the shaft 2210 in place during the assembly steps of feeding the flex through the shaft 2210.

Figure 16A:
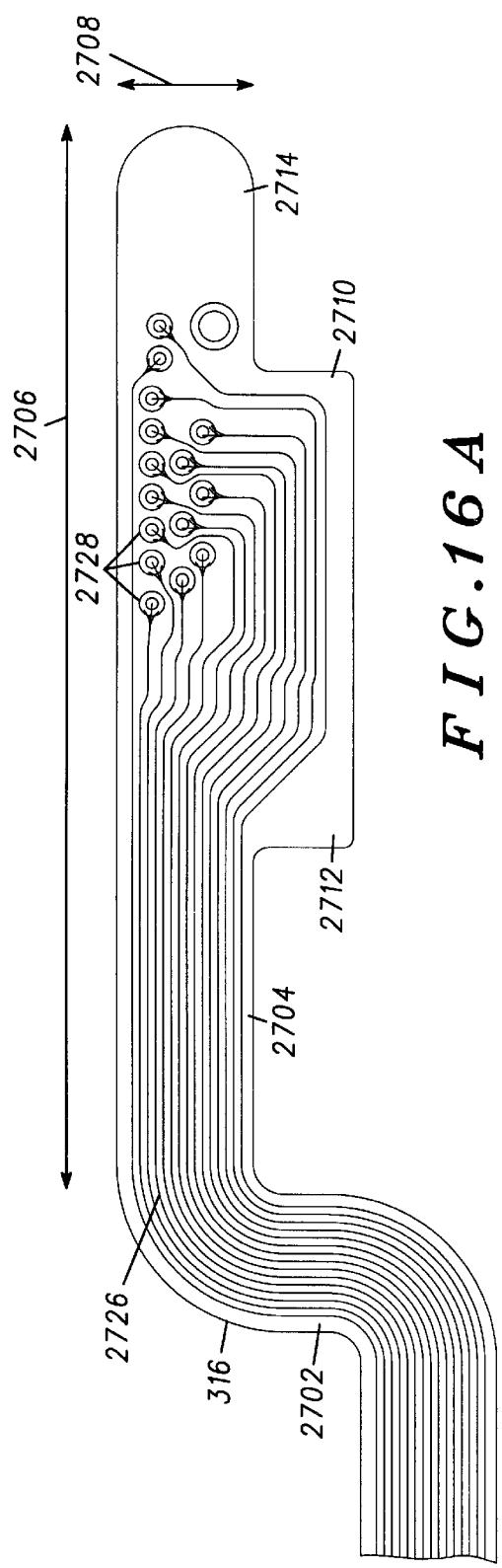
FIGS. 16A and 16B show obverse and reverse plan views of a flexible circuit element for use with the present invention.
Figure 16B:
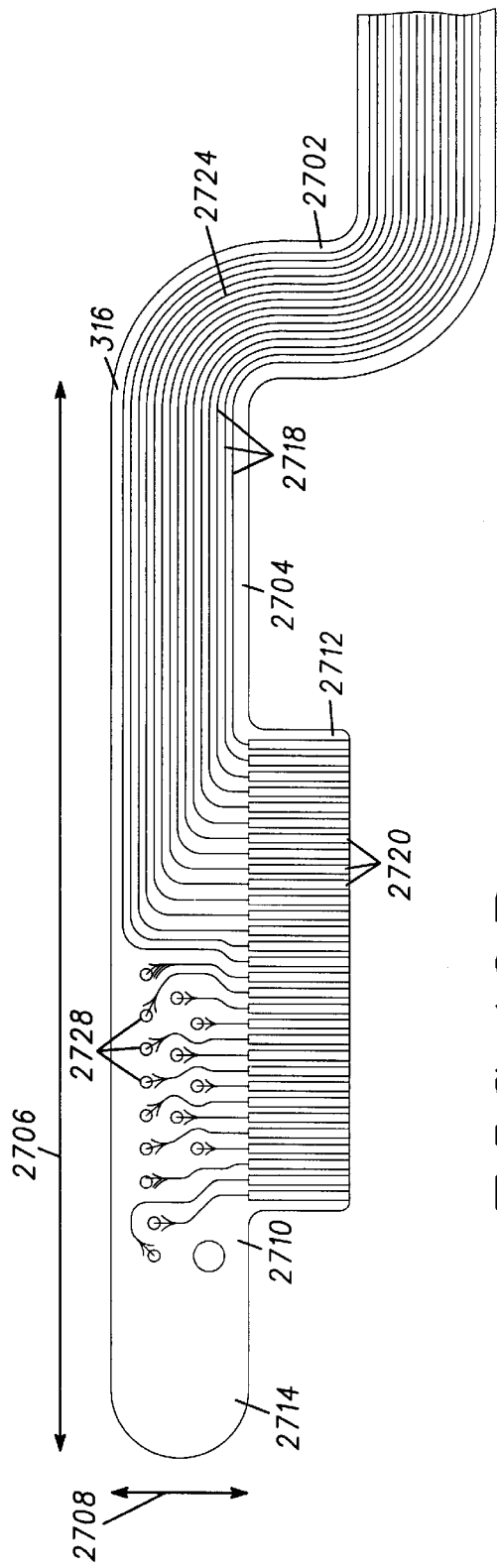

In accordance with the present invention, the flexible circuit element 316 is adapted for easy routing between the top housing 102 and the bottom housing 108. FIGS. 16A and 16B illustrates a portion of the flexible circuit element 316. The flexible circuit element 316 is also commonly referred to as a flex strip or flex.

The flexible circuit element 316 includes a flexible substrate 2702 having a body 2704. The body 2704 has a length 2706 and a width 2708. The substrate is formed of polyamide, plastic or any other suitable material having good dielectric properties as well as flexibility and resilience. The flexible circuit element 316 further includes a termination portion 2710 including a tab 2712 extending from the body 2704, as well as a leader 2714 extending from the body 2704.

For conveying electrical signals, the flexible circuit element 316 includes a plurality of conductors 2718 disposed on the flexible substrate 2702 and routed in a direction along the length 2706 of the body 2704. The conductors are also referred to as traces. The width and spacing of the conductors is controlled by manufacturing tolerances for the flexible circuit element. Typical values for the width and pitch are 0.005 inches for conductors carrying digital electronic signals and power and ground.

The flexible circuit element 316 also includes a plurality of termination pads 2720 disposed on the tab 2712 for electrical connection between the plurality of conductors 2718 and a connector. The connector is needed to form an electrical connection between the conductors 2718 of the flexible circuit element 316 and circuitry on a printed wiring board.

For example, in an electronic device such as the radiotelephone 100, the electronic device includes a first housing such as bottom housing 108 containing first operational circuitry and a second housing such as top housing 102 containing second operational circuitry. The first operational circuitry includes for example a transmitter, a receiver, a processor or other controller, a memory and a battery to power the electronic device. The second electronic circuitry includes for example a display 346 and a speaker 342. The electronic device further includes a joint element such as a hinge which movably joins the first housing and the second housing. The joint element defines a slot 2208 (FIG. 11) having a slot width. The flexible circuit element 316 is routed between the top housing 102 and the bottom housing 108 in part by passing through the slot 2208.

Referring to FIG. 17 and FIG. 18, a connector 2802 is associated with the first operational circuitry 2804, which includes a printed wiring board 2806. The connector 2802 defines a coupling aperture 2806 and includes a plurality of pins 2812 for mounting on the printed wiring board and a like plurality of connection pads 2814 disposed in the coupling aperture 2806. To reduce the size of the connector 2802, and the electronic device using the connector 2802, the plurality of pins and the plurality of connection pads are spaced to minimize width of the connector. The width and spacing of the pins and the connection pads is determined by manufacturing tolerances of the connector 2802. The coupling aperture 2806 has a predetermined engagement depth which corresponds to the length of the tab 2712 of the flexible circuit element 316. A typical value for the engagement depth is 3 mm.

The connector 2802 is configured to receive and retain a flex strip such as flexible circuit element 316. The connector 2802 includes a cover 2818 movable between an open position (FIG. 17) and a closed position (FIG. 18) for retaining the flexible circuit element 316. During assembly of the radiotelephone 100, the flexible circuit element is routed through the slot 2208, the tab 2712 is inserted in the coupling aperture 2806 and the cover 2818 is closed, retaining the tab 2712 in the connector 2802. The tab 2712 is configured for mechanical engagement with the coupling aperture 2806. That is, the tab 2712 has a width and length suitable for insertion and retention in the coupling aperture 2806, and the plurality of termination pads 2720 disposed on the tab are sized and spaced for reliable electrical connection with the connection pads 2814 disposed in the coupling aperture 2806.

For routing the flexible circuit element 316 between the top housing 102 and the bottom housing 108, the flexible circuit element 316 must be passed through the second knuckle slot 2228 and the slot 2208. The leader 2714 is conveniently inserted first in the second knuckle slot 2228 and the slot 2208 and pulled through from the other side. Also to permit routing the flexible circuit element 316 through the second knuckle slot 2228 and the slot 2208, the flexible circuit element 316 has a maximum width 2826 less than the slot width of either the second knuckle slot 2228 or the slot 2208.

To minimize the maximum width 2826 of the flexible circuit element 316, the termination pads 2720 are oriented substantially normally to the conductors 2718 of the flexible circuit element. By orienting the tab 2712 and the termination pads 2720 at a right angle to the conductors 2718, the maximum width 2826 of the flexible circuit element 316 is reduced to the tab length plus the width necessary to dispose the desired number of traces, conductors 2718, on the substrate 2702. The tab length corresponds to the engagement depth for the connector 2802 or any other PWB wiring apparatus. The spacing necessary for the conductors 2718 is set by the manufacturing tolerances for the flex strip. Thus, the width of the flexible circuit element 316 is minimized. This is important because the slot width of the slot 2208 is set to be large enough to accommodate routing of the flexible circuit element 316 through the slot 2208. If the width of the flex is minimum, the slot width, too is minimum, so that the size of the radiotelephone 100 is minimized to the extent that its width is controlled by the need to route the flexible circuit element between housings.

While a ninety degree angle has been chosen in the illustrated embodiment, other suitable angles may be chosen. The goal is to dispose the conductors 2718 on the flexible substrate 2702 to minimize the width of the body 2704 of the flexible circuit element. Previous designs have used a fan out technique in which the conductors run along the length of a flex strip and are routed to termination pads disposed at the end of the flex strip along a widened section. As can be seen in FIGS. 16A and 16B, the width necessary to place a given number of termination pads at the ends of the flex strip is considerably greater than the width necessary to place the same number of conductors along the body of the flex.

In the illustrated embodiment, the flexible circuit element 316 has a first side 2724 and a second side 2726 and the plurality of conductors 2718 is disposed on both the first side 2724 and the second side 2726. Also in the illustrated embodiment, the plurality of termination pads 2720 is disposed only on the first side 2724. The flexible circuit element 316 further includes a plurality of vias 2728 extending through the flexible circuit element 316 to electrically couple conductors on the second side 2726 to termination pads on the first side 2724. In alternative embodiments, the plurality of conductors 2718 and the plurality of termination pads 2720 are disposed on both the first side 2724 and the second side 2726. In still other alternative embodiments, more than two layers of conductors may be disposed on the flex strip.

As can be seen from the foregoing, the present invention provides method and apparatus for routing a flexible circuit element from one housing to another housing in an electronic device. The flexible circuit element includes a termination at a tab off the edge of the flex strip, oriented at an angle from the direction of flex routing. This provides the minimum possible flex width so that the flex may be routed through minimally sized openings.

While a particular embodiment of the present invention has been shown and described, modifications may be made. It is therefore intended in the appended claims to cover all such changes and modifications which fall within the true spirit and scope of the invention.

What is claimed is:

1. An electronic device comprising:
   a first housing containing first operational circuitry;
   a second housing containing second operational circuitry;
   a joint element which movably joins the first housing and the second housing, the joint element defining a slot having a slot width; and
   a flexible circuit element routed through the slot and electrically coupling the first operational circuitry and the second operational circuitry, the flexible circuit element including
      a flexible substrate having a body and a tab off an edge of the body, the body having a length and a width, and the tab having a length and a width;
      a plurality of conductors disposed side-by-side on the body along the width of the body, each of the plurality of conductors extending in a direction along the length of the body; and
      a plurality of termination pads disposed side-by-side on the tab along the length of the tab, each of the plurality of termination pads extending in a direction along the width of the tab, the termination pads oriented at an angle relative to the direction along the length of the body, and
      the flexible substrate having a maximum width less than the slot width, the maximum width defined by a combination of the widths of the body and the tab.

2. An electronic device as recited in claim 1 wherein
   the body has a first side and a second side,
   the plurality of conductors is disposed on both the first side and the second side,
   the plurality of termination pads is disposed only on the first side, and
   the flexible circuit element further comprises a plurality of vias extending through the flexible circuit element to electrically couple conductors on the second side to termination pads on the first side.

3. An electronic device as recited in claim 1 wherein
   the body has a first side and a second side, and
   the plurality of conductors are arranged in a first layer of conductors and a second layer of conductor, the first layer of conductors disposed on the first side and the second layer of conductors disposed on the second side beneath the first layer of conductors.

4. An electronic device as recited in claim 1 further comprising a connector associated with the first operational circuitry, the connector defining a coupling aperture, the tab configured for mechanical engagement with the coupling aperture.

5. An electronic device as recited in claim 4 wherein the connector includes a plurality of pins for mounting on a printed wiring board and a like plurality of connection pads disposed in the coupling aperture, the plurality of pins and the like plurality of connection pads spaced to minimize width of the connector.

6. An electronic device as recited in claim 4 wherein the connector has an engagement depth and wherein the tab has a length no longer than the engagement depth to minimize the maximum width of the flexible circuit element.

7. An electronic device as recited in claim 1 wherein the plurality of termination pads is at a right angle to the direction along the length of the body.

8. An electronic device as recited in claim 1 wherein
   the first operational circuitry comprises a transceiver, and
   the second operational circuitry comprises a display.

9. An electronic device as recited in claim 8 wherein the second operational circuitry further comprises an electro luminescent (EL) panel.

10. An electronic device as recited in claim 1 wherein the flexible substrate further comprises a leader extending from an end of the body.

11. An electronic device as recited in claim 10 wherein
   the body has a curve along a length of the body defining a shoulder, and
   the tab is positioned to extend from the body between the leader and the shoulder.

* * * * *